United States Patent [19]

Pedder

[11] Patent Number: 5,784,261
[45] Date of Patent: Jul. 21, 1998

[54] MICROCHIP MODULE ASSEMBLIES

[75] Inventor: David Pedder, Long Compton, United Kingdom

[73] Assignee: Plessey Semiconductors Limited, Wiltshire, United Kingdom

[21] Appl. No.: 594,766

[22] Filed: Jan. 31, 1996

[30] Foreign Application Priority Data

Feb. 3, 1995 [GB] United Kingdom ............... 9502178

[51] Int. Cl.⁶ ............... H05K 7/02; H01L 23/29; H01L 23/31
[52] U.S. Cl. ............... 361/767; 361/783; 361/803; 438/108; 438/109; 438/615; 257/737; 257/738; 257/788; 29/841
[58] Field of Search ............... 361/760, 761, 361/764, 767, 774, 783, 803; 257/700, 723, 724, 737, 738, 778, 779, 786, 788; 437/209, 211; 438/107, 108, 109, 126, 127, 613–617, 343, 371, 426; 29/841, 855; 228/180.22

[56] References Cited

U.S. PATENT DOCUMENTS

| 5,249,101 | 9/1993 | Frey et al. | 257/738 |
| 5,533,256 | 7/1996 | Call et al. | 437/209 |
| 5,616,958 | 4/1997 | Laine et al. | 257/778 |

*Primary Examiner*—Leo P. Picard
*Assistant Examiner*—John B. Vigushin
*Attorney, Agent, or Firm*—Kirschtein, et al.

[57] ABSTRACT

Low profile microchip module assemblies are formed by first mounting one or more active semiconductor integrated circuit chips on a multilayer metallization and dielectric structure on a substrate of, say, silicon or alumina, by wire bonding or flip-chip solder bonding, and then inverting the substrate and mounting it on a printed circuit board by means of solder bump connections. The solder bump connections are sufficiently high for the chips to be held clear of the printed circuit board.

3 Claims, 1 Drawing Sheet

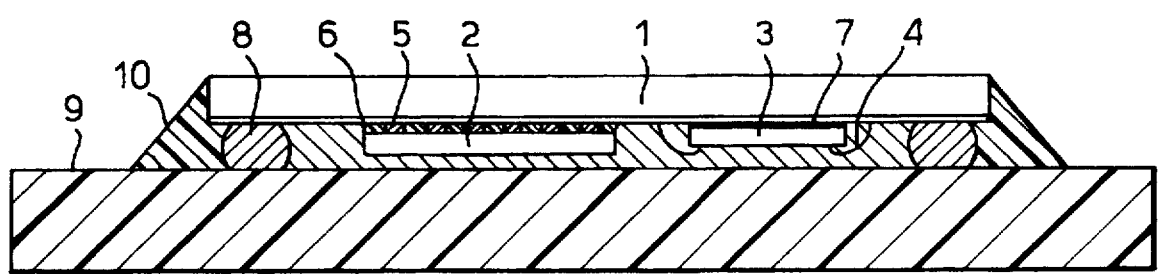

MICROCHIP MODULE ASSEMBLIES

BACKGROUND OF THE INVENTION

The present invention relates to microchip module (MCM) assemblies.

Modern microelectronic system construction is demanding ever greater levels of integration and the use of packaging techniques that provide cost effective, compact assemblies and sub-assemblies. The demand is particularly strong in the area of portable electronic products where assembly size, weight, power consumption and cost are critical. The emergence of the PCMCIA computer industry standard for miniaturised circuit card expansion slots in portable computing equipment also places a growing emphasis on the physical height of electronic assemblies.

A variety of thin film deposited technologies, known as MCM-D, have been developed to provide islands of high density integration in such electronics assemblies. The MCM-D assemblies involve multiple silicon, GaAs and related active devices mounted on the MCM-D substrate by wire bonding or by flip chip solder bonding. The MCM-D substrate provides a multilayer metallisation and dielectric structure defined on a silicon, alumina or other suitable base substrate layer to provide ground, power and signal routing structures and, in certain MCM-D processes, a full range of integrated thin film passive components, including resistors, capacitors and inductors. The substrate is manufactured by IC-like processing methods and employs feature sizes that are between those of standard IC and pcb processes.

A variety of techniques may be employed for packaging MCM-D assemblies. High reliability, high thermal dissipation MCM-D designs may be packaged in hermetic ceramic enclosures manufactured by established methods. Module designs that require an hermetic environment for reasons of device performance stability, for example where SAW devices are included within the package structure, may also employ ceramic packaging techniques. The package form factor will be selected according to the application and may include leadless ceramic chip carriers, leaded ceramic flatpacks, pin grid arrays, land grid arrays and ball grid arrays.

Plastic packaging techniques may also be employed with MCM-D assemblies. Substrate assemblies may be mounted on metallic lead frames, wire bonds made between the substrate and the lead frame and the plastic package body defined by injection moulding. Alternatively, where compatible base substrate materials, such as alumina are employed, the package leads may be brazed directly to the MCM-D base material and this assembly then processed through the plastic moulding stage. Plastic packaging usually involves lower packaging costs than ceramic packaging and is therefore a preferred option where the level of module integration, thermal dissipation, device stability and compatibility allow.

The above MCM-D packaging techniques all involve greater physical thickness than single chip IC packaging, due to the presence of separate substrate and chip layers.

SUMMARY OF THE INVENTION

According to the present invention there is provided a module on board structure in which a microchip module assembly, comprising a microchip module substrate and at least one active semiconductor device mounted on said substrate, is mounted on and connected directly to electrical conductors formed on a surface of a fine line printed circuit board by means of an array of solder bump connections, with said active device between said microchip module substrate and said surface.

Such a structure allows very low profile, low cost assembly and packaging of thin film deposited, MCM-D assemblies directly onto the surface of fine line printed circuit boards. The structure utilises an MCM-D substrate onto which active silicon, GaAs and related devices are assembled by wire bonding or flip chip bonding. This assembly is inverted and mounted on and connected directly to the printed circuit board by an array of solder sphere connections. The mounted assembly may be protected from environmental degradation by filling the space between the inverted MCM-D assembly and the circuit board with a filled epoxy material that has an expansion coefficient closely matched to that of the solder sphere material.

BRIEF DESCRIPTION OF THE DRAWINGS

A module on board structure will now be described with reference to the drawing, which shows the structure diagrammatically in cross-section.

DETAILED DESCRIPTION OF THE PREFERRED EMBODIMENTS

Referring to the drawing the MCM-D substrate 1 comprises a silicon, alumina or other suitable base substrate on which is defined the multilayer metallisation and dielectric structure that provides the ground, power and signal routing functions and integrated passive components (not shown). Active devices 2 and 3 are attached to the substrate 1 and interconnected by wire bonding 4 or by flip chip solder bonding 5, the latter technique being preferred in this case. In either case, the device thickness should be minimised. GaAs devices are conventionally manufactured at 100 to 200 micrometers thickness and are therefore immediately compatible with this structure. Silicon ICs, that are manufactured at 525 micrometers thickness and above, require back lapping to thicknesses of 200 to 300 micrometers in order to be compatible with this approach. The MCM-D substrate base layer will be typically the same thickness as standard silicon IC wafers, i.e. 525 micrometers.

Where flip chip solder bonding 5 is employed, the gap between the chip and the MCM-D substrate is filled with a suitable filled polymeric encapsulent material 6. Such materials are filled with inorganic filler compounds to ensure that the final thermal expansion coefficient is close to that of the solder alloy composition employed in the flip chip solder bonds 5. The underfill material 6 ensures good thermal and power cycling and the absence of voids when the board level assembly is finally encapsulated. The flip chip encapsulent material 6 is applied by a capillary action, infiltration process at a slightly elevated temperature (60° to 100° C.) from a series of lines of the uncured encapsulent material dispensed along one or more sides of the flip chip device 2. The underfill material is then cured by a suitable thermal treatment to develop its final properties.

Where wire bonding 4 is employed, film or other adhesive materials 7 may be employed to attach the die to the substrate. The wire bonding is required to be low profile to ensure compatibility with the module on board structure. After wire bonding, polymeric encapsulation of the wires may be employed to provide mechanical protection in subsequent handling operations.

The MCM-D substrate 1 is further provided with larger diameter solder bump connection points 8 to provide the electrical connections to the printed circuit board 9 in the final assembly. These solder bumps 8 will commonly be defined around the perimeter of the module substrate 1, although connections within the substrate area may be employed to advantage in some applications. The solderable metallisation and solder layers for these solder bumps may be applied in the same process steps that are employed to define the solder bumps for the active device attachment. Typical materials for these layers include solderable CrC-uAu multilayer metallisations and 95% Pb-5% Sn solder (wt %). The dimensions and separations of these larger diameter bonds will be determined primarily by the height of the mounted devices 2 and 3 on the MCM-D substrate 1. The bond height must be greater than the mounted component height, i.e. typically greater than 200 micrometers. The bond diameter is likely to be in the range from 100 to 500 micrometers. A proportion of the solder volume required in the final module-to-board connections may be supplied in the substrate bumping process. This may involve a substrate bump thickness between 15 and 125 micrometers. Additional solder volume may be added to the module-to-board connections in the form of discrete solder spheres that are alloyed with the deposited solder layer. Such solder spheres may employ high melting point 90% Pb-10% Sn solder or low melting point eutectic solder as required.

After device assembly to the MCM-D substrate 1 and completion of the underfill and encapsulation processes, the module is functionally tested prior to assembly to the printed circuit board 9.

The fine line printed circuit board 9 to which the MCM-D substrate 1 is attached is provided with a matching array of solderable copper lands and solder bumps as required. The board level solder bumps may be defined using solder plating techniques in which solder is applied over an area larger than the land area and then reflowed to increase the local solder bump height. Alternatively discrete solder spheres may be employed as described earlier. The solderable regions of the copper metallisation on the board are defined by means of a suitably patterned solder resist masking layer.

The prepared substrate module is inverted and soldered onto the bumped printed circuit board 9 using standard surface mounting pick and place and solder reflow equipment. Suitable flux materials may be employed to improve wetting of the solder joints. After solder bonding the flux residues may be removed by appropriate solvent cleaning procedures. The overall solder connection geometries are designed to give a separation between the MCM-D substrate active surface and the circuit board surface of about 400 micrometers.

After solder bonding, the gap between the board and the MCM-D assembly may be filled, in a similar manner to that employed for the MCM-D flip chip devices 2, with a suitable, filled polymeric encapsulent material 10. As noted earlier, such materials are filled with inorganic filler compounds to ensure that the final thermal expansion coefficient is close to that of the solder alloy composition employed in the flip chip solder bonds themselves. The underfill material 10 ensures good thermal transfer between module 1 and the board 9, and high solder joint reliability under conditions of thermal and power cycling. The reliability enhancement aspect is of particular importance as a result of the mismatch of thermal expansion coefficients between the silicon or alumina MCM-D substrate 1 and the printed circuit board material. The module encapsulent material is also applied by a capillary action, infiltration process at a slightly elevated temperature (60° to 100° C.) from a series of lines of the uncured encapsulent material dispensed along one or more sides of the module assembly. The underfill material is then cured by a suitable thermal treatment to develop its final properties. Acceptable reliability is anticipated for such module assemblies up to 15 mm on a side between silicon MCM-D substrates and standard, FR4 printed circuit card materials under commercial environmental conditions.

The overall MCM-D module on board structure provides a low profile assembly, with a height equal to the total of the MCM-D substrate thickness and the solder connection height (typically up to 1.0 mm). The area of the assembly is equal to the module substrate area plus the small surrounding miniscus area associated with the incorporation of the underfill material. This then allows the attachment of local heat sink or electrical screening structures (not shown) to the rear of the MCM-D substrate 1. Local screening structures may also be incorporated into the printed circuit board construction below the assembly.

The structure described above also involves the absolute minimum volume of packaging materials and, through the use of the solder connection method, the use of a single mounting and bonding operation. This must therefore lead to a minimal packaging cost for the particular module on board function.

I claim:

1. A module on board structure, comprising:
   a) a microchip module assembly mounted on, and connected directly to, electrical conductors formed on a surface of a fine-line printed circuit board, the microchip module assembly including
      i) a substrate of electrically insulating material having formed on one major surface thereof a multilayer metallization and dielectric structure;
      ii) at least one active semiconductor device mounted on said one major surface of said substrate;
      iii) means electrically connecting said at least one active semiconductor device to at least one metallization layer on said one major surface of said substrate; and
      iv) a first filler layer of a heat conducting electrically insulating encapsulant material between said at least one active semiconductor device and said one major surface of said substrate;
   b) a plurality of solder bumps directly connecting conductors on said one major surface of said substrate to conductors on said surface of said printed circuit board, said solder bumps having a coefficient of thermal expansion; and
   c) a second filler layer of a heat conducting electrically insulating encapsulant material between said one major surface of said substrate and said printed circuit board, said encapsulant material of said second filler layer having a coefficient of thermal expansion substantially matched to said coefficient of said solder bumps.

2. The module on board structure in accordance with claim 1, wherein said at least one active semiconductor device is mounted on said one major surface of said substrate by a flip-chip solder bond that leaves spaces between said at least one active semiconductor device and said one major surface of said substrate, and wherein said encapsulant material of said first filler layer has a coefficient of thermal expansion substantially matching a coefficient of thermal expansion of said solder bond.

3. The module on board structure in accordance with claim 1, wherein said multilayer metallization and dielectric structure incorporates a ground plane metallization; and means, including some of said solder bumps, for connecting said ground plane metallization with screening structures on said printed circuit board.

* * * * *